(12) United States Patent
Goto et al.

(10) Patent No.: US 7,667,750 B2
(45) Date of Patent: Feb. 23, 2010

(54) PHOTOELECTRIC-CONVERSION-LAYER-STACK-TYPE COLOR SOLID-STATE IMAGING DEVICE

(75) Inventors: Takashi Goto, Kanagawa (JP); Nobuo Suzuki, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 453 days.

(21) Appl. No.: 11/746,666

(22) Filed: May 10, 2007

(65) Prior Publication Data
US 2007/0279501 A1 Dec. 6, 2007

(30) Foreign Application Priority Data
May 18, 2006 (JP) ............................. 2006-139111

(51) Int. Cl.
*H04N 3/14* (2006.01)
*H04N 5/335* (2006.01)

(52) U.S. Cl. ...................... 348/273; 348/281; 348/308; 257/294

(58) Field of Classification Search ........................ None
See application file for complete search history.

(56) References Cited

U.S. PATENT DOCUMENTS

| | | | |
|---|---|---|---|
| 5,965,875 A | 10/1999 | Merrill | |
| 6,300,612 B1 | 10/2001 | Yu | |
| 7,456,384 B2 * | 11/2008 | Toda | 250/226 |
| 7,566,855 B2 * | 7/2009 | Olsen et al. | 250/208.1 |
| 2003/0209651 A1 * | 11/2003 | Iwasaki | 250/214.1 |
| 2005/0212940 A1 * | 9/2005 | Kobayashi | 348/316 |

FOREIGN PATENT DOCUMENTS

| | | |
|---|---|---|
| JP | 2002-502120 A | 1/2002 |
| JP | 2002-83946 A | 3/2002 |
| JP | 2002-513145 A | 5/2002 |
| JP | 2003-332551 A | 11/2003 |

* cited by examiner

*Primary Examiner*—Ngoc-Yen T Vu
(74) *Attorney, Agent, or Firm*—Sughrue Mion, PLLC

(57) ABSTRACT

A color solid-state imaging device including: a semiconductor substrate; a photoelectric conversion layer provided over the semiconductor substrate, for absorbing light of a first color among three primary colors so as to generate photocharges; plural charge storage regions arranged in a surface layer of the semiconductor substrate, for storing the photocharges; plural first photodiodes arranged in the surface layer of the substrate, for detecting mixed light of second and third colors among the three primary colors that has passed through the photoelectric conversion layer and for storing generated photocharges; plural second photodiodes arranged in the surface layer of the semiconductor substrate, for detecting light of the second color of the mixed light that has passed through the photoelectric conversion layer and for storing generated photocharges; color filter layers provided over the second photodiodes, for interrupting light of the third color; and signal reading units as defined herein.

18 Claims, 4 Drawing Sheets

PHOTOELECTRIC-CONVERSION-LAYER-STACK-TYPE COLOR SOLID-STATE IMAGING DEVICE

FIELD OF THE INVENTION

The present invention relates to a photoelectric-conversion-layer-stack-type color solid-state imaging device in which incident light of one of the three primary colors is detected by a photoelectric conversion layer laid on a semiconductor substrate and incident light of the other two colors that has passed through the photoelectric conversion layer is detected by photoelectric conversion elements (photodiodes) formed in the semiconductor substrate. In particular, the invention relates to a photoelectric-conversion-layer-stack-type color solid-state imaging device which is high in color separation performance and efficiency of light utilization.

BACKGROUND OF THE INVENTION

In single-plate color solid-state imaging devices as typified by CCD image sensors and CMOS image sensors, three or four kinds of color filters are arranged in mosaic form on an arrangement of photoelectric conversion pixels. With this structure, color signals corresponding to the color filters are output from the pixels, respectively, and a color image is generated by performing signal processing on those color signals.

However, color solid-state imaging devices in which color filters are arranged in mosaic form have a problem that they are low in efficiency of light utilization and sensitivity because ⅔ of incident light is absorbed by the color filters in the case where they are color filters for the primary colors. The fact that each pixel produces a color signal of only one color raises a problem of low resolution. In particular, false colors appear noticeably.

To solve the above problems, imaging devices having a structure that photoelectric conversion layers are stacked in three layers on a semiconductor substrate on which signal reading circuits are formed are being studied and developed (refer to JP-T-2002-502120 (The symbol "JP-T" as used herein means a published Japanese translation of a PCT patent application.) (corresponding to U.S. Pat. No. 6,300,612) and JP-A-2002-83946, for example). For example, these imaging devices have a pixel structure that photoelectric conversion layers which generate signal charges (electrons or holes) in response to blue (B) light, green (G) light, and red (R) light are laid in this order from the light incidence surface. Furthermore, these imaging devices are provided with signal reading circuits capable of independently reading, on a pixel-by-pixel basis, signal charges generated by the photoelectric conversion layers.

In imaging devices having the above structure, almost all of incident light is photoelectrically converted into signal charges to be read and hence the efficiency of utilization of visible light is close to 100%. Furthermore, since each pixel produces color signals of the three colors (R, G, and B), these imaging devices can generate good, high-resolution images (no false colors appear noticeably) with high sensitivity.

In the imaging device disclosed in JP-T-2002-513145 (U.S. Pat. No. 5,965,875), triple wells (photodiodes) for detecting optical signals are formed in a silicon substrate and signals having different spectra (i.e., having peaks at B (blue), G (green), and R (red) wavelengths in this order from the surface) are obtained so as to correspond to different depths in the silicon substrate. This utilizes the fact that the distance of entrance of incident light into the silicon substrate depends on the wavelength. Like the imaging devices disclosed in JP-T-2002-502120 (corresponding to U.S. Pat. No. 6,300,612) and JP-A-2002-83946, this imaging device can produce good, high-resolution images (no false colors appear noticeably) with high sensitivity.

However, in the imaging devices disclosed in JP-T-2002-502120 (corresponding to U.S. Pat. No. 6,300,612) and JP-A-2002-83946, it is necessary that photoelectric conversion layers be formed in order in three layers on a semiconductor substrate and vertical interconnections be formed which transmit R, G, and B signal charges generated in the respective photoelectric conversion layers to the signal reading circuits formed on the semiconductor substrate. As such, these imaging devices have problems that they are difficult to manufacture and they are costly because of low production yields.

On the other hand, the imaging device disclosed in JP-T-2002-513145 (U.S. Pat. No. 5,965,875) is configured in such a manner that blue light is detected by the shallowest photodiodes, red light is detected by the deepest photodiodes, and green light is detected by the intermediate photodiodes. However, the shallowest photodiodes also generate photocharges when receiving green or red light, as a result of which the spectra of R, G, and B signals are not separated sufficiently from each other. Therefore, to obtain true R, and B signals, it is necessary to perform addition/subtraction processing on output signals of photodiodes, which means a heavy computation load. Another problem is that the addition/subtraction processing lowers the S/N ratio of an image signal.

The imaging device disclosed in JP-A-2003-332551 (FIGS. 5 and 6) has been proposed as one capable of solving the problems of the imaging devices of JP-T-2002-502120 (corresponding to U.S. Pat. No. 6,300,612), JP-A-2002-83946 and JP-T-2002-513145 (U.S. Pat. No. 5,965,875). This imaging device is a hybrid type of the imaging devices of JP-T-2002-502120 (corresponding to U.S. Pat. No. 6,300,612) and JP-A-2002-83946 and the imaging device of JP-T-2002-513145 (U.S. Pat. No. 5,965,875) and is configured as follows. Only a photoelectric conversion layer (one layer) that is sensitive to green (G) light is laid on a semiconductor substrate and, as in the conventional image sensors, incident light of blue (B) and red (R) that has passed through the photoelectric conversion layer is detected by two sets of photodiodes that are formed in the semiconductor substrate so as to be arranged in its depth direction.

Since it is sufficient to form only one photoelectric conversion layer (one layer), the manufacturing process is simplified and cost increase or reduction in yield can be avoided. Furthermore, since green light which is in an intermediate wavelength range is absorbed by the photoelectric conversion layer, the separation between the spectral characteristics of the photodiodes for blue light and those for red light which are formed in the semiconductor substrate is improved, whereby the color reproduction performance is improved and the S/N ratio is increased.

SUMMARY OF THE INVENTION

Although the color separation performance is improved, the above-described hybrid imaging device is still insufficient to take high-quality color images because it attains red/blue separation relying on the wavelength dependence of the distance of light entrance into the semiconductor substrate.

An object of the present invention is to provide a hybrid photoelectric-conversion-layer-stack-type color solid-state imaging device having high color separation performance.

The invention provides a photoelectric-conversion-layer-stack-type color solid-state imaging device characterized by comprising a semiconductor substrate; a photoelectric conversion layer laid over the semiconductor substrate, for absorbing light of a first color among three primary colors and thereby generating photocharges; plural charge storage regions arranged in a surface layer of the semiconductor substrate, for storing the photocharges; plural first photodiodes arranged in the surface layer of the substrate, for detecting mixed light of second and third colors among the three primary colors that has passed through the photoelectric conversion layer and for storing generated photocharges; plural second photodiodes arranged in the surface layer of the semiconductor substrate, for detecting light of the second color of the mixed light that has passed through the photoelectric conversion layer and for storing generated photocharges; color filter layers formed over the second photodiodes, for interrupting light of the third color; and signal reading units for reading out amounts of the charges stored in the charge storage regions and the photodiodes, respectively.

The photoelectric-conversion-layer-stack-type color solid-state imaging device according to a preferable embodiment of the invention is characterized in that the color filter layers are made of an inorganic material.

The photoelectric-conversion-layer-stack-type color solid-state imaging device according to a preferable embodiment of the invention is characterized in that the inorganic material is amorphous silicon or polysilicon.

The photoelectric-conversion-layer-stack-type color solid-state imaging device according to a preferable embodiment of the invention is characterized in that average transmittance of the inorganic material for light of the third color is less than or equal to ½ of that for light of the second color.

The photoelectric-conversion-layer-stack-type color solid-state imaging device according to a preferable embodiment of the invention is characterized in that the first color is green, the second color is red, and the third color is blue.

The photoelectric-conversion-layer-stack-type color solid-state imaging device according to a preferable embodiment of the invention is characterized in that each of the signal reading units comprises a MOS transistor or a charge-coupled device.

The photoelectric-conversion-layer-stack-type color solid-state imaging device according to a preferable embodiment of the invention is characterized by further comprising microlenses for converging incident light on top portions of the photodiodes, respectively.

According to the invention, the color separation performance is improved by the color filter layers and the efficiency of light utilization is increased because no color filter layers are formed over the first photodiodes. Where the color filter layers are made of an inorganic material, an existing semiconductor integrated circuit manufacturing technology can be used for forming the layers under the photoelectric conversion layer, whereby the production yield can be increased.

DESCRIPTION OF SYMBOLS

Figure 1:
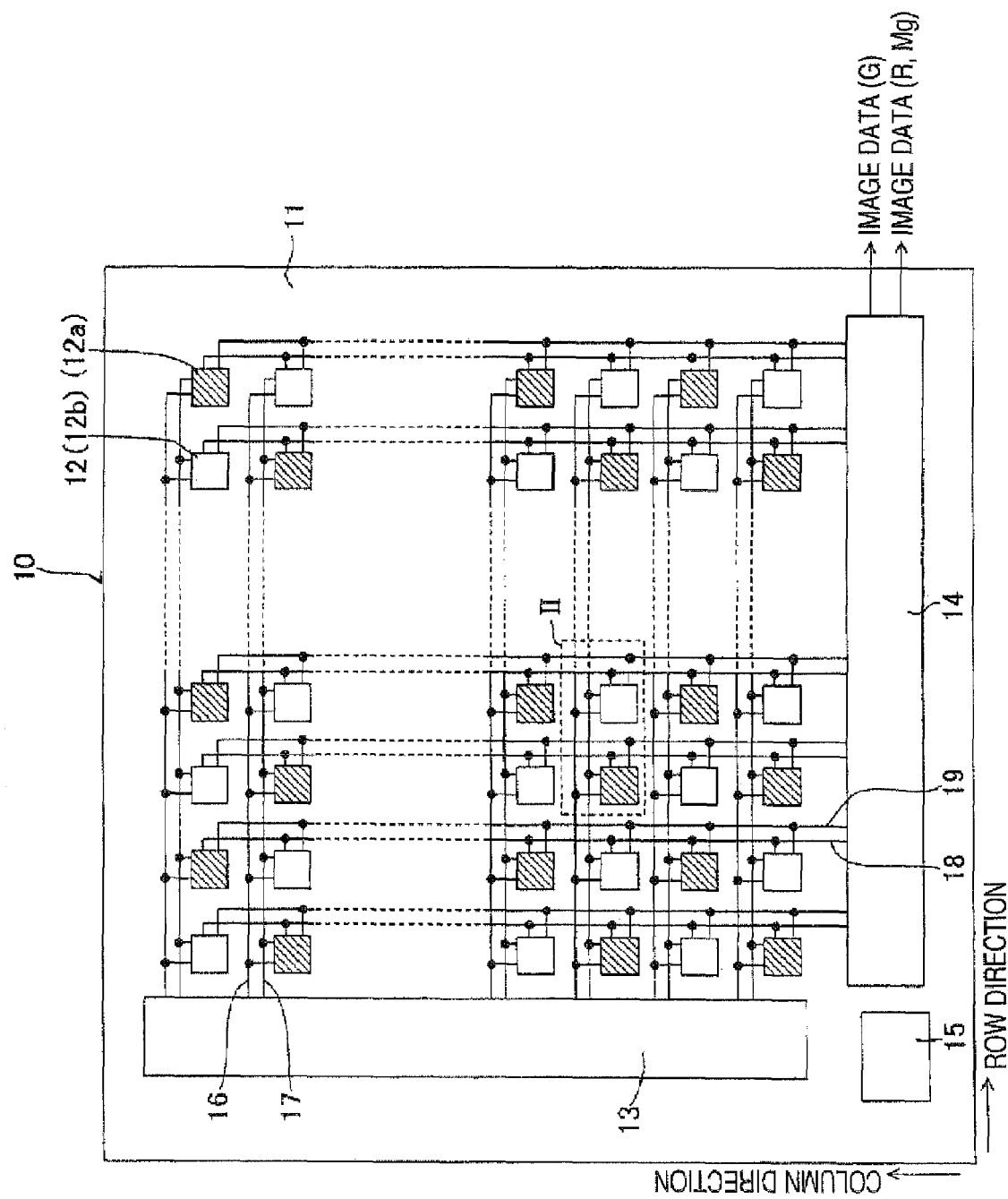
FIG. 1 schematically shows the surface of a photoelectric-conversion-layer-stack-type color solid-state imaging device according to a first embodiment of the present invention.

10: Photoelectric-conversion-layer-stack-type color solid-state imaging device
12: Pixel
12a: Green (G) and red (R) detecting pixel
12b: Green (G) and magenta (Mg) detecting pixel
21: Semiconductor substrate
22: p-type well layer
23: n-type region
24: Surface p-type layer
25: Charge storage region
27: Transparent insulating layer
28: Pixel electrode layer
29, 53: Vertical interconnection
30: Green-sensitive photoelectric conversion layer
31: Common electrode layer (counter electrode layer)
33: Color filter layer made of inorganic material
41, 42, 43, 44: Signal reading circuit
52: Color filter layer made of organic material

DETAILED DESCRIPTION OF THE INVENTION

One embodiment of the present invention will be hereinafter described with reference to the drawings.

Embodiment 1

FIG. 1 schematically shows the surface of a photoelectric-conversion-layer-stack-type color solid-state imaging device according to the embodiment of the invention. In the photoelectric-conversion-layer-stack-type color solid-state imaging device 10 according to the embodiment, plural pixels 12 are arranged in square Lattice form on a photodetecting surface of a substrate 11.

The pixels 12 are classified into two kinds of pixels 12a and 12b. The pixels 12a and the pixels 12b are formed on the photodetecting surface in checkered form. Alternatively, rows (or columns) of pixels 12a arranged in stripes and rows (or columns) of pixels 12b arranged in stripes are arranged alternately.

A row-selection scanning section 13 is provided adjacent to the left sideline of the substrate 11 and an image signal processing section 14 is provided adjacent to the bottom sideline. A control section 15 for generating timing pulses and control signals is provided at a proper position.

Signal reading circuits (not shown) are provided for each pixel 12. The signal reading circuits for each pixel 12 are connected to the column-selection scanning section 13 via a reset signal line 16 and a row-selection signal line 17 and connected to the image signal processing section 14 via two column signal lines 11 and For example, the signal reading circuits may be transistor circuits having a 3-transistor or 4-transistor structure as used in existing CMOS image sensors. Likewise, the column-selection scanning section 13 and the image signal processing section 14 may be the same as used in existing CMOS image sensors.

Although the photoelectric-conversion-layer-stack-type color solid-state imaging device 10 of the illustrated example incorporates the MOS signal reading circuits, it may employ such a configuration that signal charges produced by the respective pixels 12 are read out by charge transfer channels (vertical charge transfer channels VCCDs and a horizontal charge transfer channel HCCD) like existing CCD (charge-coupled device) solid-state imaging devices do.

Figure 2:
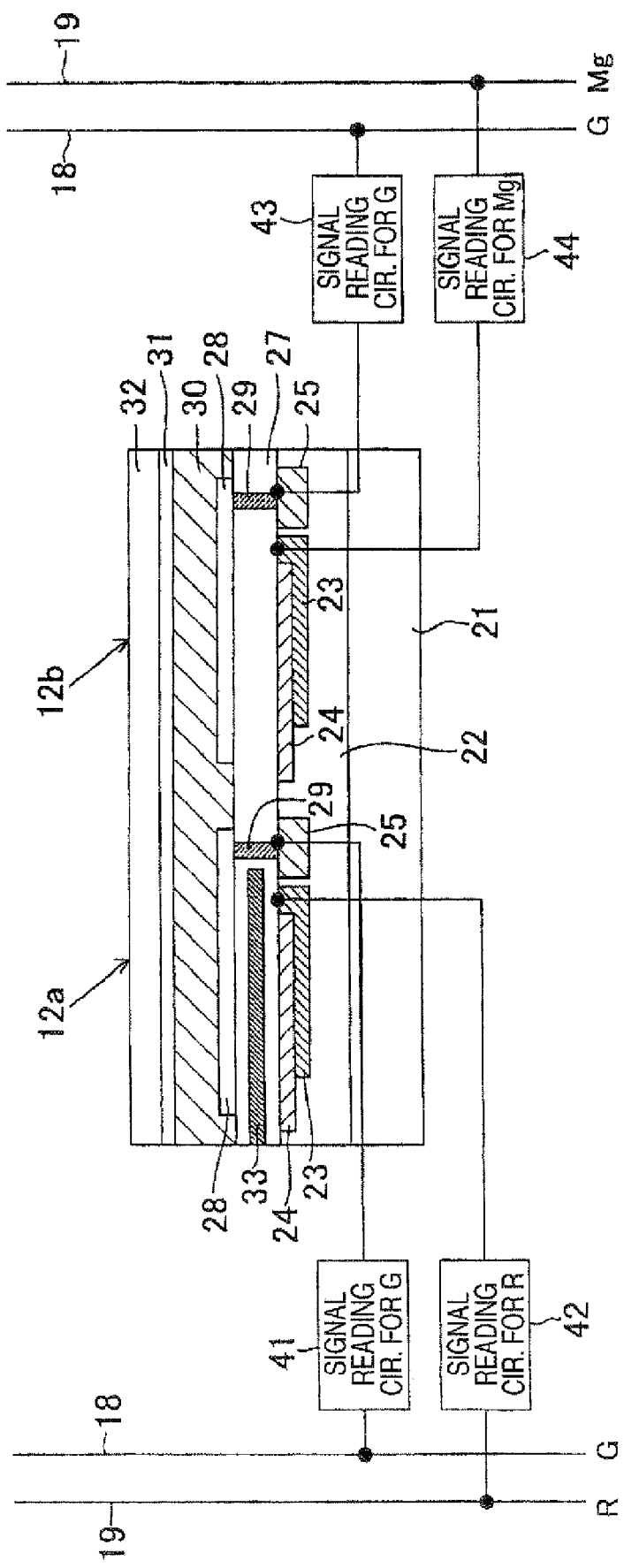
FIG. 2 is a schematic sectional view of a part enclosed by a broken-like rectangle II in FIG. 1.

FIG. 2 is a schematic sectional view of two kinds of pixels 12a and 12b that are enclosed by a broken-line rectangle II in FIG. 1. A p-type well layer 22 is formed in a surface layer of an n-type semiconductor substrate 21 (denoted by symbol 11 in FIG. 1). And an n-type semiconductor layer (n-type region) 23 for detecting incident light is formed in a surface portion of the p-type well layer 22 in each of the pixels 12a and 12b. As a result, pn junctions, that is, photodiodes (photoelectric conversion elements) are formed. A surface p-type layer 24 for dark current suppression is formed on the surface side of each n-type semiconductor layer 23 as in the case of known CCD image sensors and CMOS image sensors.

A small-area charge storage region 25 is formed between each adjoining pair of n-type semiconductor layers 23 in the p-type well layer 22. Each charge storage region 25 is shielded from light by a shield layer (not shown) so that no light shines on it.

A transparent insulating layer 27 is laid on the surface of the semiconductor substrate 21, and a transparent pixel electrode layer 28 which is divided so as to correspond to the respective pixels 12 is laid on the surface of the transparent insulating layer 27. Each section of the pixel electrode layer 28 is connected to the corresponding charge storage region 25 via a vertical interconnection 29.

A photoelectric conversion layer 30 which is sensitive to green light is laid on the pixel electrode layer 28 so as to cover all the pixels, and a transparent common electrode layer (a counter electrode layer opposed to the pixel electrode layer 28) 31 is laid on the photoelectric conversion layer 30. A transparent protective layer 32 is laid as a top layer.

For example, each of the transparent electrode layers 28 and 31 may be an ITO layer or a thin metal layer. The common electrode layer 31 may be such that a single layer covers all the pixels, it is divided so as to correspond to the respective pixels and the sections are connected to each other by wiring, or it is divided into columns or rows which are connected to each other by wiring.

The photoelectric conversion layer 30 maybe made of an organic semiconductor material, Alq, or a quinacridone compound or formed by laying nanosilicon having an optimum grain size. Any of these materials is laid on the pixel electrode layer 28 by sputtering, a laser abrasion method, printing, spraying, or the like.

The photoelectric-conversion-layer-stack-type color solid-state imaging device 10 according to the embodiment is characterized in that a polysilicon layer (or amorphous silicon layer) 33 to serve as a color filter layer is buried in that portion of the transparent insulating layer 27 which corresponds to the pixel 12a and no color layer is provided in that portion of the transparent insulating layer 27 which corresponds to the pixel 12b.

The color filter layer 33 is separated from the nearby vertical interconnection 29. This is because polysilicon is conductive and hence signal charge flowing through the vertical interconnection 29 may flow into the color filter layer 33 if the color filter layer 33 is in contact with the vertical interconnection 29.

Figure 3A:
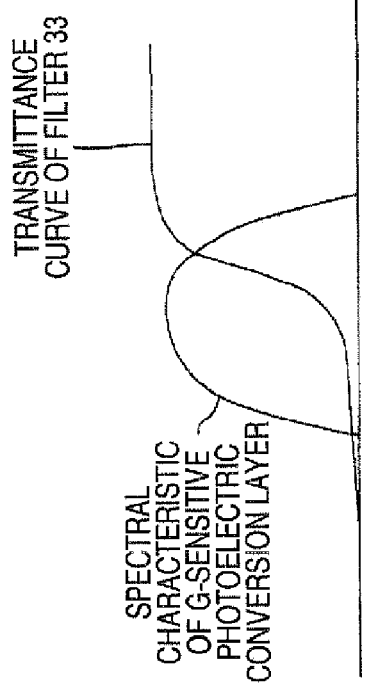
FIGS. 3A and 3B shows incident light wavelength vs. transmittance curves of a color filter layer shown in FIG. 2.
Figure 3B:
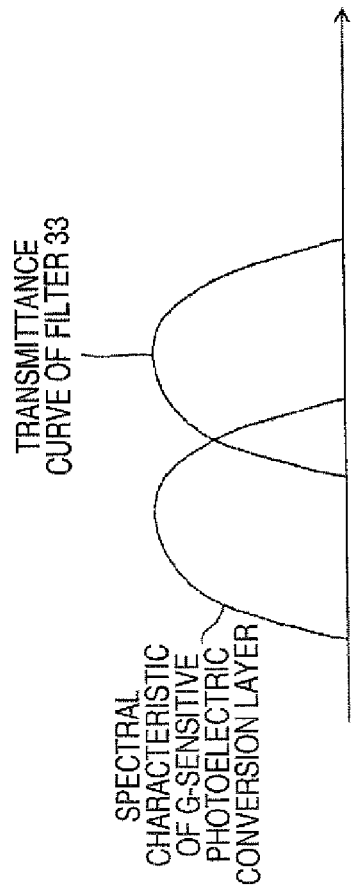

For example, the color filter layer 33 is made of a material having such a transmittance curve as to cut blue light and transmit red light but cut infrared light (see FIG. 3A) or a material having such a F transmittance curve as to cut blue light and transmit red light as well as infrared light (see FIG. 3B). The transmittance curve as shown in FIG. 3B is obtained if the color filter layer 33 is made of polysilicon or amorphous silicon. It is preferable that the average transmittance for red light R be two times or more higher than that for blue light D. If the selection ratio of red light to blue light is smaller than 2, the color reproduction performance or the S/N ratio may be lowered due to color contamination.

In this embodiment, two signal reading circuits are provided for each pixel 12. Although the signal reading circuits are formed on the semiconductor substrate 21 by using an integrated circuit technology, the details of their formation process will not be described because it is the same as that of known CMOS image sensors.

A first signal reading circuit 41 and a second signal reading circuit 42 are provided for the pixel 12a. The input terminal of the signal reading circuit 41 is connected to the charge storage region 25 of the pixel 12a, and its output terminal is connected to a column signal line 18. The input terminal of the signal reading circuit 42 is connected to the n-type semiconductor layer 23 of the pixel 12a and its output terminal is connected to a column signal line 19.

A third signal reading circuit 43 and a fourth signal reading circuit 44 are provided for the pixel 12b. The input terminal of the signal reading circuit 43 is connected to the charge storage region 25 of the pixel 12b, and its output terminal is connected to a column signal line 18. The input terminal of the signal reading circuit 44 is connected to the n-type semiconductor layer 23 of the pixel 12b and its output terminal is connected to a column signal line 19.

When light coming from an object shines on the photoelectric-conversion-layer-stack-type color solid-state imaging device 10 having the above configuration, green light of the incident light is absorbed by sections of the photoelectric conversion layer 30 that correspond to pixels 12a and 12b and signal charges generated in the photoelectric conversion layer 30 flow into the charge storage regions 25 corresponding to the pixels 12a and 12b via the vertical interconnections 29.

Blue light and red light of the incident light pass through the photoelectric conversion layer 30. In each pixel 12a, the blue light and the red light that have passed through the photoelectric conversion layer 30 enter the transparent insulating layer 27 but the shorter-wavelength blue light is absorbed by the polysilicon layer 33 and does not reach the n-type semiconductor layer 23. That is, signal charge that is produced through photoelectric conversion by the n-type semiconductor layer 23 and stored there corresponds to the light quantity of the red light.

In each pixel 12b, since no color filter layer is formed in the transparent insulating layer 27, both of blue light and red light enter the n-type semiconductor layer 23 and are photoelectrically converted and generated charge is stored there. The quantity of this signal charge corresponds to the quantity of red/blue mixed light, that is, magenta (Mg) light.

Signals corresponding to the charges stored in the charge storage regions 25 and the n-type semiconductor layers 23 of the pixels 12a and 12b are read by the signal reading circuits 41-44, processed by the image signal processing section 14, and then output as image data. Since the output image data are green (G) image data, red (R) image data, and magenta (Mg: red R plus blue B) image data, image data of the three primary colors (R, G, and B) can easily be obtained by signal processing.

In this embodiment, each pixel 12b is not provided with a color filter for cutting red light and blue image data B is obtained by signal processing. This is to increase the efficiency of light utilization. Where color separation is performed by color filters, light that is cut by the color filters does not contribute to photoelectric conversion and hence is useless though the color separation performance is high.

In contrast, in this embodiment, the color filter is provided for only one of the two kinds of pixels, which minimizes the amount of light that is rendered useless. In addition, since light of green (G) which is the intermediate color among the three primary colors R, G, and B is separated by the photoelectric conversion layer 30, the material of the color filters 33 for separating red light R from magenta light Mg (red light R plus blue light B) can be selected easily. Alternatively, the color filters 33 may be made of a material which transmits blue light and cuts red light.

Finely controlling the material components of the color filters 33 enables another configuration in which the photoelectric conversion layer 30 separates red light R and the color filters 33 cut blue light B or green light G of cyan light Cy (blue light B plus green light G) that has passed through the photoelectric conversion layer 30. A further configuration is enabled in which the photoelectric conversion layer 30 separates blue light B and the color filters 33 cut red light R or green light G of yellow light Ye (red light R plus green light G) that has passed through the photoelectric conversion layer 30.

Exemplary materials of the photoelectric conversion layer for separating red light are inorganic materials such as GaAlAs and Si and organic materials such as ZnPc (zinc phthalocyanine)/Alq3 (quinolinole aluminum complex). Exemplary materials of the photoelectric conversion layer for separating blue light are inorganic materials such as InAlP and organic materials such as C6/PHPPS (coumarin 6 (C6)-doped poly(m-hexoxyphenyl)phenylsilane).

Where the photoelectric conversion layer 30 is made of an inorganic material, it is preferable to use electrons as signal charge because the electrons of hole-electron pairs generated through absorption of light by the photoelectric conversion layer 30 have higher motility. This is because carriers having high mobility are low in the probability of extinction during transport as well as in the probability of being captured by trap states. On the other hand, where the photoelectric conversion layer 30 is made of an organic semiconductor material, it is preferable to use holes as signal charge because holes have higher mobility.

In this embodiment, the color filter layers 33 are made of an inorganic material such as amorphous silicon or polysilicon. Although in FIG. 2 the transparent insulating layer 27 in which the color filter layers 33 are buried is a single layer, in practice it is a multilayer structure consisting of a silicon nitride layer and a silicon oxide layer, for example, and wiring layers for connecting the signal reading circuits 41-44 to the n-type semiconductor layers 33 and the charge storage regions 25 are formed between those layers. The color filter layers 33 may be formed by sputtering or evaporation in forming one of those layers.

Where the color filter layers 33 are made of an inorganic material as in the embodiment, an existing semiconductor integrated circuit manufacturing technology can be used as it is from the start to the step of forming the pixel electrode layer 28 (see FIG. 2) on the surface of the semiconductor substrate 21 (to the step of forming the protective layer 32 in the case where the photoelectric conversion layer 30 is made of an inorganic material) and the vertical interconnections 29 can be formed easily. As a result, the production yield of the photoelectric-conversion-layer-stack-type color solid-state imaging device can be increased and hence its manufacturing cost can be reduced.

In general, the color filter layers 33 being made of an inorganic material can be made thinner than color filter layers made of an organic material are because the former exhibit a larger light absorption coefficient. As a result, the overall height of the solid-state imaging device can be reduced and hence shading can be suppressed. The device can thus be miniaturized easily.

In the above embodiment, no microlenses are provided. However, microlenses (top lenses) may be provided on those portions of the protective layer 32 which are located in the pixels 12a and 12b. Alternatively, microlenses (inner lenses) may be provided beneath those portions of the photoelectric conversion layer 30 which are located in the pixels 12a and 12b. The microlenses serve to converge incident light on the photodetecting surfaces of the n-type semiconductor layers 23.

Embodiment 2

Figure 4:
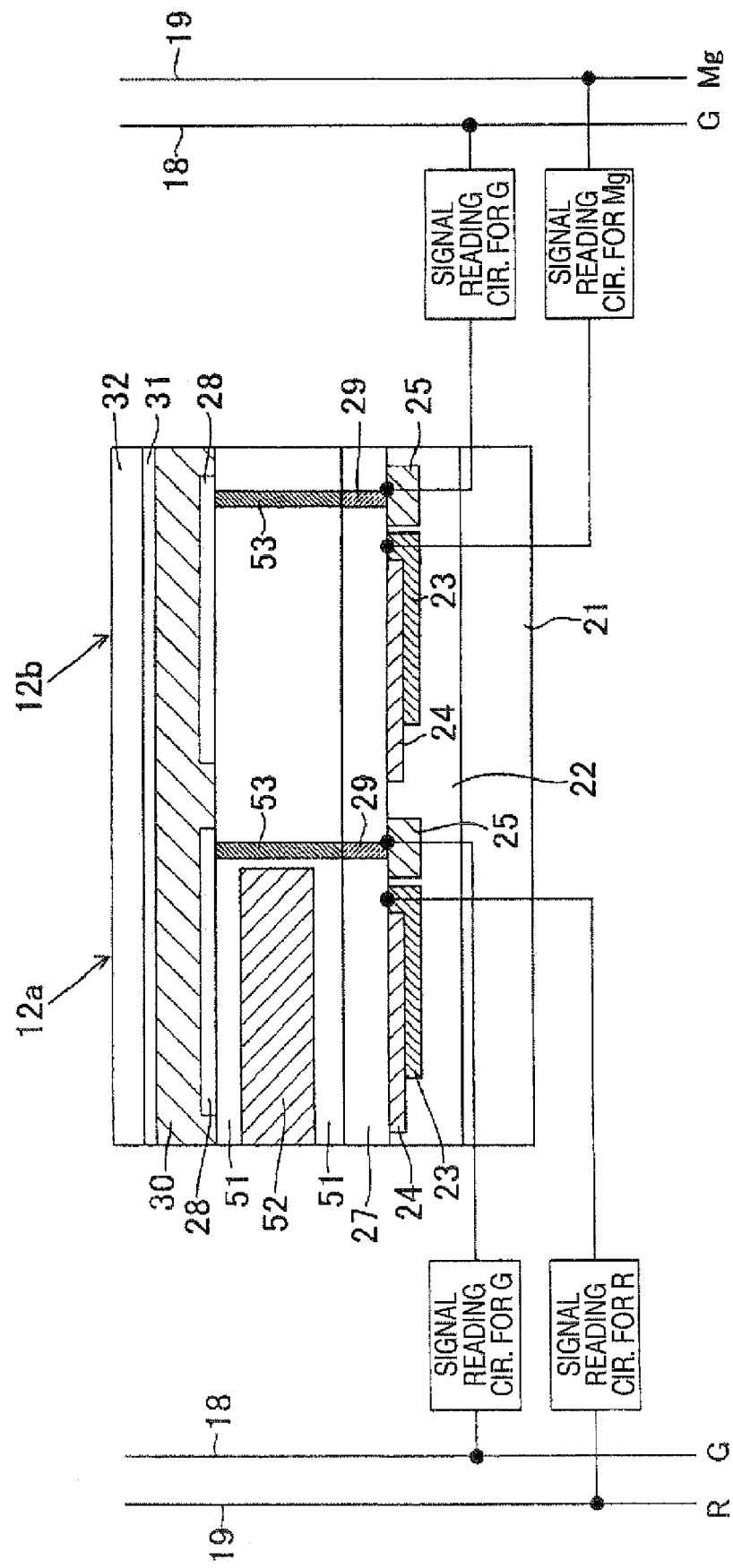
FIG. 4 is a schematic sectional view of a photoelectric-conversion-layer-stack-type color solid-state imaging device according to a second embodiment of the invention.

FIG. 4 is a schematic sectional view of a hybrid photoelectric-conversion-layer-stack-type color solid-state imaging device according to a second embodiment of the invention. The photoelectric-conversion-layer-stack-type color solid-state imaging device according to this embodiment has approximately the same configuration as that according to the first embodiment shown in FIG. 2 and is different from the latter only in that the color filter layers are made of an organic material. Therefore, the same layers etc. as shown in FIG. 2 are given the same symbols as the corresponding ones in FIG. 2 and will not be described below. Only different layers etc. will be described.

In the photoelectric-conversion-layer-stack-type color solid-state imaging device according to this embodiment, a smooth layer 51 made of an organic material is formed between the transparent insulating layer 27 and the pixel electrode layer 28. In each pixel 12a, a color filter layer 52 for transmission of red light which is made of an organic material is formed in the smooth layer 51.

The color filter layers 52 can be formed by using a color filter material and a forming method that are usually employed in manufacturing an existing CCD image sensor or CMOS image sensor.

In this embodiment, an existing semiconductor integrated circuit manufacturing technology is used from the start to the step of forming the transparent insulating layer 27 and the organic material layers 51 and 52 are formed thereon. Therefore, the overall thickness of the imaging device is larger than in the first embodiment. However, this embodiment is suitable for cost reduction because an existing manufacturing method and materials can be used. It is noted that vertical interconnections 53 for connecting the vertical interconnections 29 to the pixel electrode layer 28 need to be formed in the organic material layer 51.

Each of the above-described embodiments makes it possible to manufacture, at a low cost, a photoelectric-conversion-layer-stack-type color solid-state imaging device which is high in color separation performance and efficiency of light utilization.

The hybrid photoelectric-conversion-layer-stack-type color solid-state imaging device according to the invention can take color images that are superior in color reproduction performance and high in sensitivity and resolution because the color separation performance of the plural photodiodes formed in the semiconductor substrate is improved. With an additional advantage that it can be manufactured at a low cost, it is useful when used in place of conventional CCD image sensors or CMOS image sensors.

This application is based on Japanese Patent application JP 2006-139111, filed May 18, 2006, the entire content of which is hereby incorporated by reference, the same as if set forth at length.

What is claimed is:

1. A color solid-state imaging device comprising:

a semiconductor substrate;

a photoelectric conversion layer provided over the semiconductor substrate, for absorbing light of a first color among three primary colors so as to generate photocharges;

plural charge storage regions arranged in a surface layer of the semiconductor substrate, for storing the photocharges;

plural first photodiodes arranged in the surface layer of the substrate, for detecting mixed light of second and third colors among the three primary colors that has passed through the photoelectric conversion layer and for storing generated photocharges;

plural second photodiodes arranged in the surface layer of the semiconductor substrate, for detecting light of the second color of the mixed light that has passed through the photoelectric conversion layer and for storing generated photocharges;

color filter layers provided over the second photodiodes, for interrupting light of the third color; and signal reading units for reading out amounts of the charges stored in the charge storage regions and the photodiodes, respectively.

2. The color solid-state imaging device according to claim 1, wherein the color filter layers are made from an inorganic material.

3. The color solid-state imaging device according to claim 2, wherein the inorganic material is amorphous silicon or polysilicon.

4. The color solid-state imaging device according to claim 1, wherein average transmittance of the color filter layer for light of the third color is less than or equal to ½ of that for light of the second color.

5. The color solid-state imaging device according to claim 2, wherein average transmittance of the inorganic material for light of the third color is less than or equal to ½ of that for light of the second color.

6. The color solid-state imaging device according to claim 3, wherein average transmittance of the inorganic material for light of the third color is less than or equal to ½ of that for light of the second color.

7. The color solid-state imaging device according to claim 1, wherein the first color is green, the second color is red, and the third color is blue.

8. The color solid-state imaging device according to claim 2, wherein the first color is green, the second color is red, and the third color is blue.

9. The color solid-state imaging device according to claim 3, wherein the first color is green, the second color is red, and the third color is blue.

10. The color solid-state imaging device according to claim 4, wherein the first color is green, the second color is red, and the third color is blue.

11. The color solid-state imaging device according to claim 5, wherein the first color is green, the second color is red, and the third color is blue.

12. The color solid-state imaging device according to claim 6, wherein the first color is green, the second color is red, and the third color is blue.

13. The color solid-state imaging device according to claim 1, wherein each of the signal reading units comprises a MOS transistor or a charge-coupled device.

14. The color solid-state imaging device according to claim 2, wherein each of the signal reading units comprises a MOS transistor or a charge-coupled device.

15. The color solid-state imaging device according to claim 3, wherein each of the signal reading units comprises a MOS transistor or a charge-coupled device.

16. The color solid-state imaging device according to claim 1, further comprising microlenses for converging incident light, provided over the photodiodes, respectively.

17. The color solid-state imaging device according to claim 2, further comprising microlenses for converging incident light, provided over the photodiodes, respectively.

18. The color solid-state imaging device according to claim 3, further comprising microlenses for converging incident light, provided over the photodiodes, respectively.

* * * * *